(12) United States Patent
Schwemmlein et al.

(10) Patent No.: US 7,174,543 B2
(45) Date of Patent: Feb. 6, 2007

(54) HIGH-SPEED PROGRAM TRACING

(75) Inventors: Joerg Schwemmlein, Gloucester, MA (US); Paul D. Krivacek, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 554 days.

(21) Appl. No.: 10/231,722

(22) Filed: Aug. 29, 2002

(65) Prior Publication Data

US 2003/0051231 A1    Mar. 13, 2003

Related U.S. Application Data

(60) Provisional application No. 60/315,655, filed on Aug. 29, 2001.

(51) Int. Cl.
G06F 9/44 (2006.01)

(52) U.S. Cl. .......................... 717/128; 717/129; 714/35

(58) Field of Classification Search ................ 717/128, 717/124, 127, 129, 126; 714/34, 35, 46
See application file for complete search history.

(56) References Cited

U.S. PATENT DOCUMENTS

| | | | |
|---|---|---|---|
| 5,596,764 A | * | 1/1997 | Intrater et al. ................ 712/34 |
| 5,724,505 A | | 3/1998 | Argade et al. |
| 6,032,268 A | * | 2/2000 | Swoboda et al. ............. 714/30 |
| 6,145,122 A | * | 11/2000 | Miller et al. ................ 717/129 |
| 6,516,408 B1 | * | 2/2003 | Abiko et al. ................ 712/227 |
| 6,760,866 B2 | * | 7/2004 | Swoboda et al. ............. 714/34 |

FOREIGN PATENT DOCUMENTS

| | | |
|---|---|---|
| EP | 0 762 276 A1 | 3/1997 |
| EP | 0 992 907 A2 | 4/2000 |

OTHER PUBLICATIONS

"Embedded Trace Macrocell", Specification, ARM IHI 0014H, ARM Limited, 1999-2001.

* cited by examiner

Primary Examiner—Todd Ingberg
(74) Attorney, Agent, or Firm—Wolf, Greenfield & Sacks, P.C.

(57) ABSTRACT

A high speed program tracer providing compression using linear increment run length values, displacement values corresponding to discontinuities, and loop compression. A program count sequencer receives program count values from a processor, and outputs various program count values and signals to allow compression calculations to be made based upon linear increment run lengths, discontinuity detection, and detection of repeating instruction loops. Compression may be achieved using selected numbers of words to represent various compression values.

7 Claims, 5 Drawing Sheets

FIG. 3

| TYPE | LENGTH | WORD1 | WORD2 | WORD3 | WORD4 | WORD5 |
|---|---|---|---|---|---|---|
| SYNCHRONIZATION & IDLE | 1 (302) | 00000000 | | | | |
| LINEAR POSITIVE INCREMENT (0..63) | 1 (304) | 01dddddd (304a) | | | | |
| SIGNED DISPLACEMENT (-32..31) | 1 (306) | 01sddddd (306a 306b) | | | | |
| LINEAR INCREMENT/DISPLACEMENT (-4096..4095) | 2 (308) | 001sdddd (308a 308b) | dddddddd | | | |
| LINEAR INCREMENT/DISPLACEMENT $(-2^{19}..2^{19}-1)$ | 3 (310) | 0001sddd (310a 310b) | dddddddd | dddddddd | | |
| SIGNED DISPLACEMENT $(-2^{25}..2^{25}-1)$ | 4 (312) | 000011sd (312a 312b) | dddddddd | dddddddd | dddddddd | |
| FULL PC | 5 (314) | 00001010 | 1ddddddd | dddddddd | dddddddd | dddddddd |
| FULL PC | 5 (316) | 00001011 | 1ddddddd | dddddddd | dddddddd | dddddddd |
| INNER LOOP COUNT | 3 (318) | 00001000 | dddddddd | dddddddd | | |
| OUTER LOOP COUNT | 2 (320) | 00001001 | dddddddd | | | |

HIGH-SPEED PROGRAM TRACING

RELATED APPLICATIONS

This application claims the benefit of U.S. Provisional Application 60/315,655 under 35 U.S.C. §119(e) filed Aug. 29, 2001, entitled "DIGITAL BASEBAND PROCESSOR," by Allen, et al. The entirety of the above provisional application is hereby incorporated by reference.

FIELD OF THE INVENTION

The present invention generally relates to program tracing and more particularly, to methods and apparatus that provide data compression to facilitate high speed program tracing.

BACKGROUND OF THE INVENTION

Program tracers provide an ability to track an execution sequence of a program being run on a microprocessor, a digital signal processor, a finite state machine or other processor device (generically called "processor" herein). An execution sequence is typically tracked by maintaining a log of program count values (i.e., a program trace) from a program counter (PC) (e.g., addresses or representations of addresses corresponding to program instructions that are executed). The log may be machine-interpreted into a text format, graphical format or other human-readable format for the purpose of debugging a program or otherwise analyzing its execution. Program traces provide a dynamic view into the execution sequence of a program. Such a view may be useful in efforts to improve the efficiency or speed of the program, a compiler, to study program logic, or to study the efficiency or operation of a compiler which compiles a program for the processor devices.

Because program count values may include sixteen bits or even a thirty-two bits of address data for each program instruction, and because a new instruction is typically available every clock cycle of the processor device, to trace a program by simply outputting unadulterated program count values would be burdensome and would require a great deal of physical resources. For example, a large number of dedicated pins (with related circuitry) may be necessary if every PC value is to be output from an integrated circuit on which the tracer is implemented. Further demands may result because, in addition to program counter outputs, a program tracer may multiplex program count values with other data values (e.g., data register values that provide insight into the execution sequence). In addition to physical resource demands, output of large amounts of data results in excessive power demands to generate the signals necessary to transfer the data.

Accordingly, to achieve program tracer capabilities using a reasonable amount of physical resources, program count values may be serialized (i.e., thirty-two-bit program count values are buffered and output in consecutive eight-bit segments) and compression schemes may be implemented. For example, in such schemes, because the most common program flow event is a sequential execution of instructions (i.e., the program count value increments by one to the next line of program "code" with each successive instruction), the program tracer outputs a value indicating that a single increment in the program count value has occurred, rather than outputting the entire program count value. Additionally, in the event of a discontinuity the program tracer outputs a displacement value; that is, rather than a full program count value after the execution of the discontinuity, the program tracer provides an indication of the signed difference between the program counter value before the execution of the discontinuity (also referred to as the discontinuity source program counter value) and the program counter value after the execution of the discontinuity (also referred to as the discontinuity destination program counter value). The term "discontinuity" is defined herein as an execution of instructions, in an program, having non-sequential-program count values; for example, a discontinuity may be caused by execution of a jump, a call, or a branch.

Although such program tracer capabilities have provided a reduction in the data necessary to track the execution of a program, conventional compression schemes have resulted in losses of data and therefore incomplete program traces. A loss of data may occur because the amount of data output by the program tracer is excessive. For example, an internal buffer such as the serialization buffer may be caused to overflow due to the amount of data. Accordingly, a compromise must be made between the resources designated to tracking and an acceptable level of loss of data.

What is needed is a program tracer having an improved compression scheme, to provide fewer instances of data loss. Additionally, what is needed is a program tracer having reduced physical resource demands and reduced power demands.

SUMMARY OF THE INVENTION

Program tracers according aspects of the present invention provide relatively high compression factor. Some aspects of the invention are directed to program tracers that provide linear increment run lengths, loop compression.

A first aspect of the invention is a program tracer to trace an execution sequence of a program executing on a processor, the processor having a program counter to maintain program instruction count values for program instructions as they are executed, comprising a program count sequencer operatively connected to the program counter to receive a current program count value from the program counter and also receiving notifications of discontinuities in the program, the program count sequencer generating a current-discontinuity destination count value in response to said notification, and a linear increment generator module operatively coupled to the program count sequencer to receive the current program count value and the current-discontinuity destination count value, and calculating a linear increment run length and selectively providing the linear increment run length value in response to notification of discontinuities in the program.

In some embodiments the program tracer further comprises a displacement generator module operatively coupled to the program count sequencer to receive the current program count value and the previous program count value, and calculating a displacement value in response. Optionally, the displacement generator module selectively provides displacement values in response to notification of discontinuities in the program.

A second aspect of the invention is a program tracer to trace an execution sequence of a program executing on a processor, the processor having a program counter to maintain program instruction count values for program instructions as they are executed, comprising a program count sequencer to receive to receive a current program count value from the program counter and to maintain a previous program count value, and to determine a current-discontinuity source count value and a current-discontinuity destination count value and a loop count module coupled to the program count sequencer to receive the current-discontinuity source count value and the current-discontinuity destination count value, and to maintain a first previous-discontinuity source count value and a first previous-discontinuity destination count value, and to count loop executions of at least a first loop by comparing the current-discontinuity source count value and the current-discontinuity destination count value to the first previous-discontinuity source count value and the first previous-discontinuity destination count value.

A third aspect of the invention is a method of tracing an execution sequence of a program executing on a processor having a program counter to maintain program instruction count values for program instructions as they are executed, comprising generating a current-discontinuity destination count value in response to a notification of discontinuity, and calculating a linear increment run length based on the current-discontinuity destination value and the current program count value. The method of tracing an execution sequence, may further comprise selectively providing the linear increment run length value in response to a notification of discontinuity in the program.

A fourth aspect of the invention is a method of tracing an execution sequence of a program executing on a processor, the processor having a program counter to maintain program instruction count values for program instructions as they are executed, comprising determining a current-discontinuity source count value and a current-discontinuity destination count value, and counting loop executions of at least a first loop by comparing a current-discontinuity source count value and the current-discontinuity destination count value to the first previous-discontinuity source count value and the first previous-discontinuity destination count value.

BRIEF DESCRIPTION OF THE DRAWINGS

Illustrative, non-limiting embodiments of the present invention will be described by way of example with reference to the accompanying drawings, in which the same reference number is used to designate the same components in different figures, and in which:

FIG. 3 is a table of coded values for use with one example of a compression scheme suitable for use with program tracers according to the present invention;

DETAILED DESCRIPTION

Figure 1:
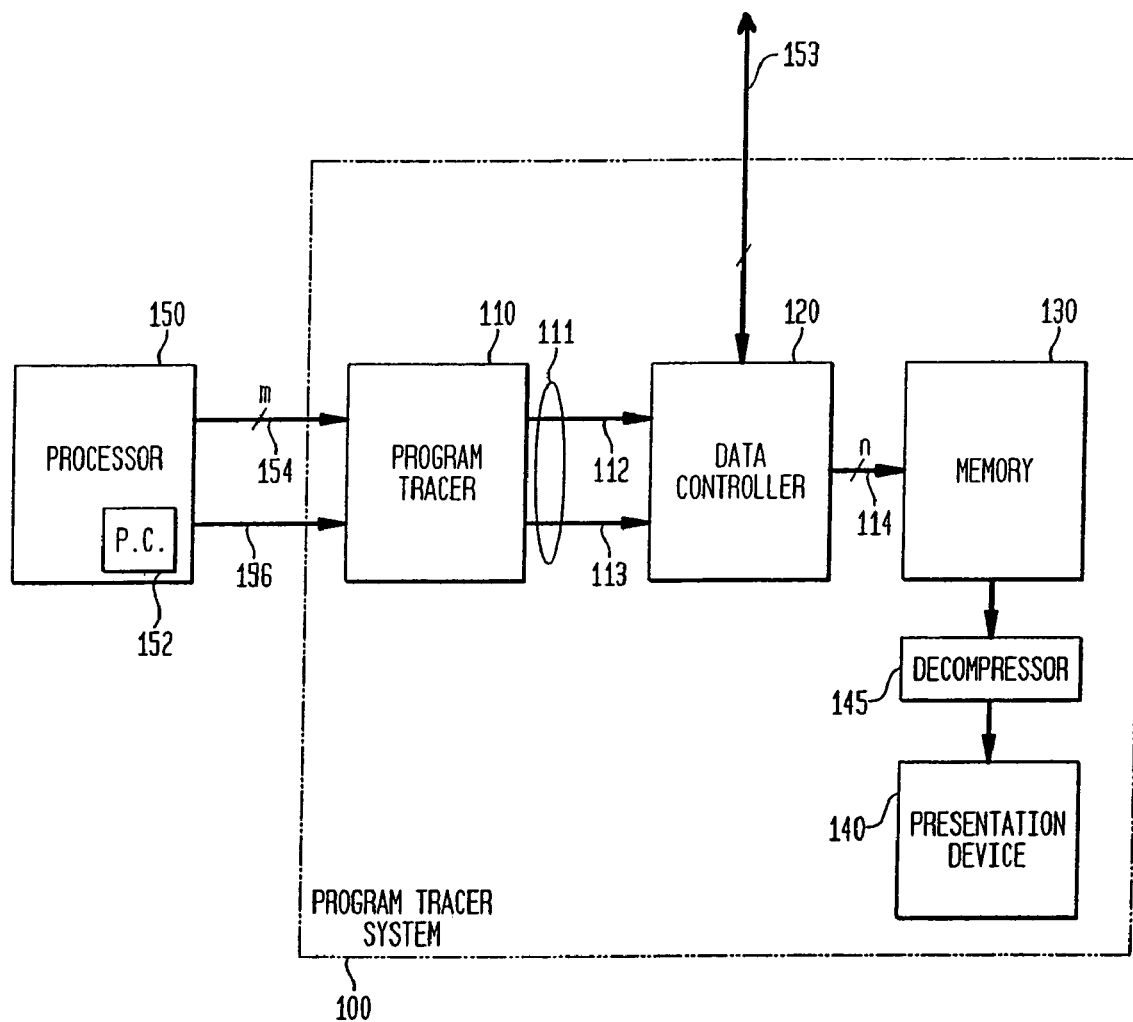
FIG. 1 is a functional block diagram of a program tracer system and a processor to execute a program to be traced.

FIG. 1 is a functional block diagram of a program tracer system 100 and a processor 150 to execute a program to be traced. Processor 150 may be any device capable of executing program instructions, and having a program counter (PC) 152 to maintain program count values (e.g., addresses or representations of addresses corresponding to program instructions that are executed) for program instructions as they are executed. For example, processor 150 may be a microprocessor, a digital signal processor, or a finite state machine. Preferably, processor 150 generates a notification of discontinuity 156 to indicate a discontinuity in the program execution. For example, a notification of discontinuity in the program execution may be generated upon the execution of an interrupt, branch, call, return instructions or a zero-overhead hardware loops. Alternatively, program tracer 110 or another resource can compare the immediately preceding PC value to the current PC value to detect and signal a discontinuity.

Program tracer system 100 includes a program tracer 110 to receive a current program count value 154 from program counter 152 and a notification of discontinuity 156. Current program count value 154 may be any length m (e.g., 16 bits or 32 bits). As described in greater detail below, program tracer 110 generates a compressed output 111 of a program trace, including one or more displacement values 112, and one or more linear increment run length values 113.

Optionally, a data controller 120 may be included to allow program tracer system 100 to output supplemental data 153, which is multiplexed with compressed output 111. For example, supplemental data 153 may include timing information or data values generated by the processor 150 during the execution of the traced program. A memory device 130 may be provided to store output 114, and an output device 140 may be included to enable analysis of output 114. A decompressor 145 may be provided to decompress compressed output 114 and thereby reconstruct the sequence of executed instructions. Presentation device 140 may be a display device such as a cathode ray tube or liquid crystal display, a printer device or any other presentation device.

Output 114 typically has a length n (e.g., 8 bits) that is shorter than program count values 154 length m (e.g., 32 bits). The reduction in length may result from compression as well as serialization of data.

Figure 2:
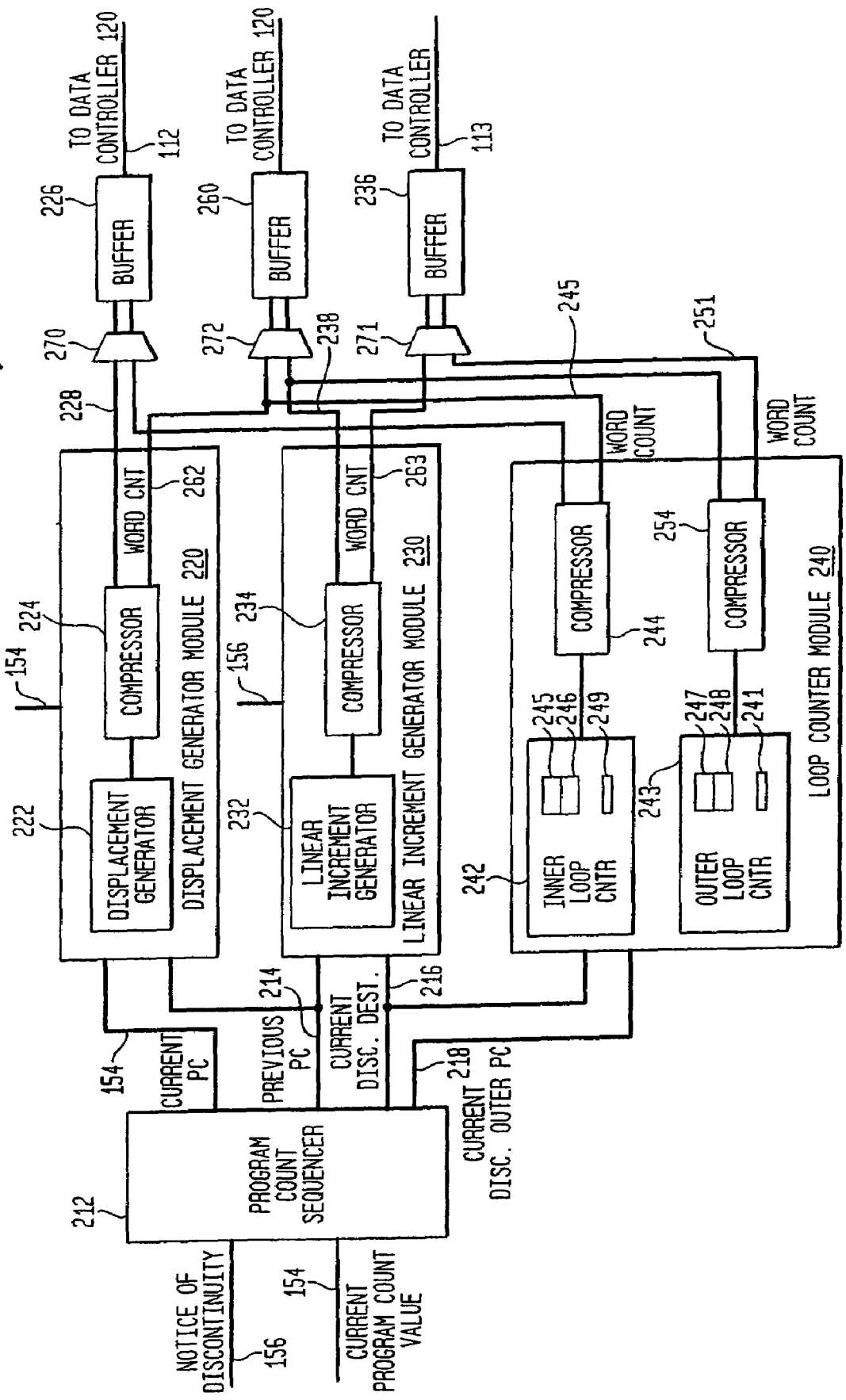
FIG. 2 is a functional block diagram of an exemplary embodiment of a program tracer according to at least some aspects of the present invention.

FIG. 2 is a functional block diagram of an exemplary embodiment of a program tracer 110 according to at least some aspects of the present invention. Program tracer 110 includes a program count sequencer 212, a displacement generator module 220, a linear increment generator module 230, and a loop count module 240. A "program count value" is also referred to herein as a "count value" or a "PC value."

Program count sequencer 212 receives a current PC value 154 from program counter 152 (shown in FIG. 1) and a notification of discontinuity 156, and provides current program count value 154, a previous PC value 214, a current-discontinuity destination PC value 216, and current-discontinuity source PC value 218. Current-discontinuity destination PC value 216, and current-discontinuity source PC value 218 refer to the discontinuity source PC value and discontinuity destination PC value of the most-recent discontinuity, respectively.

Linear increment generator module 230 is operatively coupled to program count sequencer 212 to receive the previous program count value 214 and current-discontinuity destination program count value 216, and includes a linear increment generator 232 to calculate a linear increment run length value 238. The phrase "linear increment run length value" is defined herein to be equal to the number of program instructions executed between the most-recent discontinuity and the previous discontinuity. It is to be understood that a linear increment run length value combined with a known PC value form a compressed representation of a portion of a program trace.

A linear increment compressor 234 may be included to compress the linear increment run length value 238. As described below, linear increment compressor 234 provides a selected number of words of data to represent the linear increment run length value, depending on the magnitude of increment run length value 238. Optionally compressor 234 may serialize linear increment run length values. Additionally, linear increment compressor 234 may provide a word count 263 corresponding to the selected number of words of data in the linear increment run length value.

Optionally, a buffer 236 may be coupled to the output of linear increment generator module 230 to temporarily store linear increment run length values 238. Buffer 236 may be, for example, a first-in first-out (FIFO) buffer. Linear increment run length values 238 may be accumulated in buffer 236, for example, due to serialization of the data by compressor 234 or because a data controller 120 (shown in FIG. 1 above) is included in a program tracer, thus requiring linear increment run length values 238 to be buffered while higher priority data is output via data controller 120).

In some embodiments, linear increment generator module 230 calculates a linear increment run length value as an output for each previous program count value 214 received from program count sequencer 212. That is, for each current program value, the linear increment value increases by one. However, because only linear increment run length values existing at the time of a discontinuity are necessary to maintain an accurate program trace, in some embodiments of program tracer 110, Notice of Discontinuity 156 is provided to linear increment module 230 to allow linear increment module 230 to selectively provide the linear increment run length value in response to notification of discontinuities in a program. Notice of Discontinuity 156 can be used in a number ways to prevent linear increment module 230 from providing linear increment run length values in the absence of a Notice of Discontinuity. For example, buffer 236 may be configured to store a run length value only upon receiving a Notice of Discontinuity 156, thus discarding other linear increment run length values.

Displacement generator module 220 includes a displacement generator 222 and is operatively coupled to the program count sequencer 212 to receive the current program count value 154 and the previous program count value 214. Displacement generator 222 calculates a displacement value 228 corresponding to the instruction execution sequence of a program executed by processor 150 (shown in FIG. 1 above) by calculating a difference between the current program count value 154 and the previous program count 214.

In some embodiments of program tracer 110, displacement generator module 220 calculates displacement values for each current program count value 154 received from program count sequence 212. However, because only displacement values existing at the time of a discontinuity are necessary to maintain an accurate program trace, in some embodiments of program tracer 110, Notice of Discontinuity signal 154 is provided to displacement generator module 220 to selectively provide the displacement values 228 in response to notification of discontinuities in the program. That is, the displacement value 228 is only output from displacement generator module 220 if a notice of discontinuity has been received.

Notice of Discontinuity 154 can be used in a number of ways to prevent displacement generator module 220 from providing displacement values in the absence of a Notice of Discontinuity. For example, buffer 226 may be configured to store a displacement value only upon receiving a Notice of Discontinuity 256, so that compressor 224 may be prevented from providing an output. Alternatively, multiplexer 270 may be prevented from transmitting a displacement value.

A displacement compressor 224 may be included to compress a displacement value 228. As described below, displacement compressor 224 provides a selected number of words of data depending on the magnitude of the displacement value 228. Optionally displacement compressor 224 may serialize displacement data. Additionally, displacement compressor 224 may provide a word count 262 corresponding to the selected number of words of data.

Optionally, a buffer 226 may be coupled to displacement generator module 220 to temporarily store displacement values 228. Buffer 226 may be, for example, a first-in first-out (FIFO). Displacement values 228 may be accumulated in buffer 226, for example, due to serialization of the data by compressor 224 or because a data controller 120 (shown in FIG. 1 above) is included in a program tracer, thus requiring displacement values 228 to be buffered while higher priority data is output via data controller 120).

As described with reference to FIG. 5 below, typically data controller 120 (visible in FIG. 1) reads displacement value 228 and linear increment run length value 238 from buffers 226 and 236 in pairs, which include one displacement value and one corresponding linear increment run length value.

Optionally, a signal 216 indicative that a given discontinuity was generated by an instruction having a destination with a fixed program counter value (e.g., a jump or a call having a known destination having a known program counter value) may be provided to displacement generator module 220; upon receipt of signal 216, a displacement value may be suppressed, and a null value (i.e., shown as 302 in FIG. 3 below) may be provided at output 228 by compressor 224.

In some embodiments, null values are ignored by data controller 120, such that no time is consumed processing the null value. As one or ordinary skill would understand, to reconstruct a program execution sequence include such a suppressed displacement value, reference must be made to the program to determine the appropriate displacement value.

Loop count module 240 includes at least an inner loop counter 242. Loop count module 240 is coupled to the program count sequencer 212 to receive the current-discontinuity source count value 218 and the current-discontinuity destination count value 216. Additionally, loop count module 240 maintains a first previous-discontinuity source count value 245 and a first previous-discontinuity destination count value 246.

Loop counter 242 counts loop executions of at least a first loop by comparing the current-discontinuity source count value 218 and the current-discontinuity destination count value 216 to the first previous-discontinuity source count value 245 and the previous-discontinuity destination count value 246.

Upon determining that the current-discontinuity source count value 218 and the current-discontinuity destination count value 216 are equal to the first previous-discontinuity source count value 245 and the previous-discontinuity destination count value 246, respectively, counter register 249 is incremented.

Optionally, loop count module 240 may include an outer loop counter 243 to count loop executions of a second loop. In embodiments having an outer loop counter 243, loop counter module 240 maintains a second previous-discontinuity source count value 247 and a second previous-discontinuity destination count value 248. Upon determining that the current discontinuity source count value 218 and the current-discontinuity destination count value 216 are equal to the second previous-discontinuity source count value 247 and the second previous discontinuity destination count value 248, respectively, counter register 241 is incremented. While only an inner loop counter and an outer loop counter have been discussed, program tracers having greater than two loop counters are within the scope of this invention.

A inner-loop count compressor 244 and/or outer-loop compressor 254 may be included to compress the inner-loop count and the outer-loop count, respectively. Inner-loop count compressor 244 and outer-loop count compressor 254 may provide a selected number of words of data depending on the magnitude of the loop count 248. Additionally, loop count compressors 244, 254 provide word counts 251 and 245, each corresponding to the number of words of data in the inner-loop count and the outer-loop count, respectively. As described below with reference to FIG. 4, the inner loop counter and outer loop counts may be stored in buffers 226 and 236, respectively, using multiplexers 270 and 272. A multiplexer 272 is used to store each of the word counts 262, 263, 245, and 251 in buffer 260.

FIG. 3 is a table of coded values for use with one example of a compression scheme suitable for use with program tracers according to the present invention. Coded values 304, 308, 310 may be used to code linear increment values. In an exemplary compression scheme, a selected number of words are used to represent linear increment values, based on the magnitude of the linear increment value. A prefix 304a, 308a, 310a is present in each of coded values 304, 308, 310, each prefix representing the number of words representing a linear increment value. A sign bit 308b, 310b is present in each of coded values 308, 310, as well.

Coded values 306, 308, 310, 312 may be used to code displacement values. In the exemplary compression scheme, a selected number of words is used to represent a displacement value, based on the magnitude of the displacement value. A prefix 306a, 308a, 310a, 312a is present in each of coded values 306, 308, 310, 312. The prefixes represent the number of words representing linear increment values. A sign bit 306b, 308b, 310b, 312b is present in each of coded values 306, 308, 310, 312; because a discontinuity may be a positive or a negative discontinuity, the sign bit is used to indicate positive or negative discontinuity directionality.

Coded values 318, 320 may be used to represent inner loop count values and outer loop count values, respectively. In the illustrated exemplary compression scheme, a fixed word count is used (i.e., no compression is provided); however, it is to be understood that loop count compression may be provided. For example, similar to the compression scheme above, a selected number of words may be used to represent a loop count value based on the magnitude of the loop counts.

A coded value 302 (also referred to herein as a null value) may be used if a count is zero or in the event a displacement value is suppressed as described above. In the event of a displacement suppression, coded value 302 may be output by the compressor 224 because, as discussed below, in some embodiments, displacement values and linear increment values are output alternately by data controller 120 (shown in FIG. 1 above) in pairs;. Thus, coded value 302 operates as a place holder. In some embodiments, coded value 302 is recognized by the data controller 120 and discarded without transmitting it.

In addition to the compressed values, a compressor 224, 234, 244, 254 may need to provide a full program counter value. For example in the event that a displacement value or a linear increment run length value is too large (for example, a register in displacement generator module 220 or linear increment generator module 230 is caused to overflow) a corresponding compressor 224, 234, outputs a coded value 314 including a full PC value. Also, in the event that one of buffers 226 and 236 overflow a corresponding compressor 224, 234, outputs a coded value 314 including a full PC value. Also, in addition to the illustrated coded values, coded values may be provided, each corresponding to an output from an additional source (i.e., signal 153 in FIG. 1). Coded values corresponding to such outputs allow a presentation device 140 to recognize and respond to such values.

Figure 4:
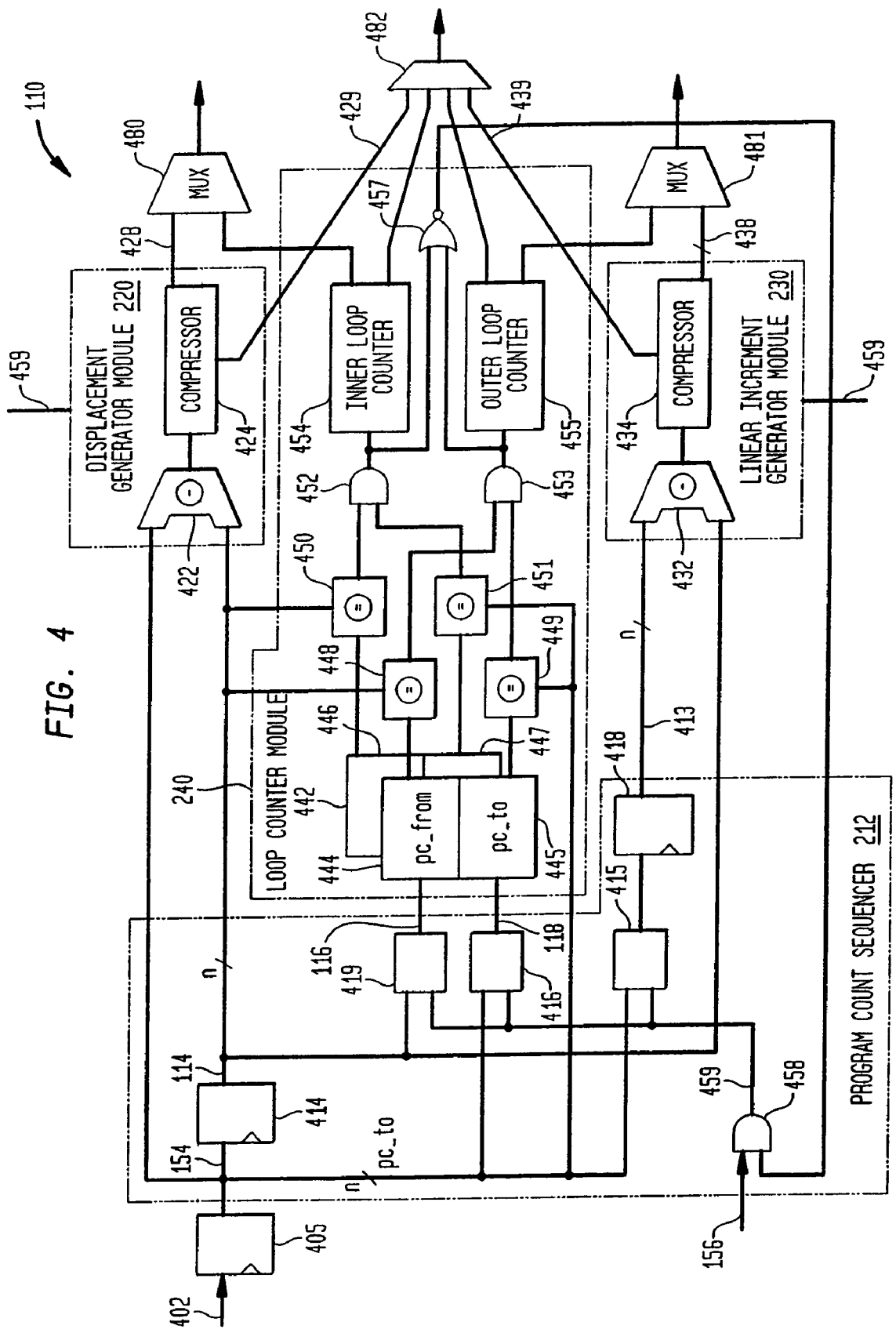
FIG. 4 is a schematic diagram of an exemplary embodiment of a program tracer according to at least some aspects of the present invention.

FIG. 4 is a schematic diagram of an exemplary embodiment of a program tracer 110 according to at least some aspects of the present invention. Program tracer 110 includes a program count sequencer 212, a displacement generator module 220, a linear increment generator module 230, and a loop count module 240.

Program count sequencer 212 receives current program count value 154 from the program counter 152 (shown in FIG. 1) and a Notification of Discontinuity 156. Current PC value 154 is delayed one clock cycle and maintained by a delay device 414, such as a flip flop, to provide previous program count value 114. It is to be understood that the current PC value need not be the PC value 402 corresponding to the current program instruction being executed by a processor executing the program being traced. For example, PC value 402 of the current program instruction being executed may be delayed by a delay device 405. However, previous PC value 114 should be the PC value that existed one clock cycle before the current PC value 154; and Notice of Discontinuity 156 should be delayed an amount equal to the amount that current PC value 154 is delayed relative to PC value 402.

Program count sequencer 212 generates current-discontinuity destination PC value 118 by inputting current program count value 154 and notification of discontinuity 156 into a logical-AND device 416 (e.g., an AND gate). Program count sequencer 212 generates current-discontinuity source count value 116 by inputting previous program count value 114 and Notice of Discontinuity 256 into a logical-AND device 419. Logical-AND device 415 and delay device 418 operate to provide a previous-discontinuity destination value 413 to linear increment generator module 230.

Linear increment generator module 230, receives the previous program count value 114 and previous-discontinuity destination count value 413, and includes a difference device 432 to calculate a linear increment run length value by calculating the difference between previous program count value 114 and previous-discontinuity destination count value 413.

Linear increment generator module 230 may include a compressor 434. Compressor 434 may use any suitable compression scheme (several of which are known in the art) to reduce the total number of bits necessary to provide a linear increment run length value 438. For example, compressor 434 may use the compression scheme discussed above with reference to FIG. 3. The linear increment run length value calculated by difference device 432 may be converted to a coded value 304, 308, 310 in accordance with the selected compression scheme, using any known method. For example, a look-up table may be used to provide a coded value; alternatively, an appropriate header may be appended to the output of difference device 432 based on the magnitude of the difference.

In some embodiments, a maximum of three words are possible; however, due to the header, and a sign data bit, a maximum of 19 bits then are available to indicate the linear increment run length value (i.e., the maximum linear increment run length value magnitude is $2^{19}$). In the event that the magnitude of the output of difference device is in excess of $2^{19}$, compressor 434 provides a coded value 314 (shown in FIG. 3) corresponding to an absolute PC value.

As discussed above, in some embodiments, compressor 434 provides a word count 439 corresponding to number of words in linear increment run length value 438. As discussed below with reference to FIG. 5, the word count may be used by data controller 120 to coordinate the output of the compressed trace sequence.

Displacement generator module 220, receives the previous program count value 114 and current program count value 254, and includes a difference device 422 to calculate a displacement value 428 by calculating the difference between previous program count value 114 and current program count value 154.

Displacement generator module 220 may include a compressor 424. Compressor 424 may use any compression scheme to reduce the total number of bits necessary to provide displacement value 428. For example, compressor 424 may use the compression scheme discussed above with reference to FIG. 3. The displacement value calculated by difference device 422 may be converted to a coded value 306, 308, 310, 312 in accordance with the compression scheme illustrated in FIG. 3, using any known method; for example, a look-up table may be used to provide a coded value; alternatively, an appropriate header may be appended to the output of difference device 422 based on the magnitude of the difference.

In some embodiments, a maximum of four words are possible; however, due to the header, and a sign data bit, a maximum of 25 bits are available to indicate the difference (i.e., the maximum difference magnitude is $2^{25}$). In the event that the magnitude of the output of difference device is in excess of $2^{25}$, compressor 424 produces a coded value 314 (shown in FIG. 3) corresponding to an absolute PC value.

As discussed above, in some embodiments, compressor 424 provides a word count 429 corresponding to number of words in output 428. As discussed below with reference to FIG. 5, the word count may be used by data controller 120 to coordinate the output of the compressed trace sequence.

A loop count module includes a memory 442 (e.g., a 2×n FIFO buffer) containing at least a first previous-discontinuity source count value 444 and a first previous-discontinuity destination count value 445. In the illustrated exemplary embodiment, memory 442 is a 2×2 FIFO buffer, thus it also includes a second previous-discontinuity source count value 446 and a second previous-discontinuity destination count value 447. It is to be appreciated that memory 442 may be a memory (e.g., a 2×n FIFO buffer) including any number of previous previous-discontinuity source count value and a first previous-discontinuity destination count value.

Loop counter module 240 compares each previous program count value 114 and current program count value 154 generated by program count sequencer 212, to first previous-discontinuity source count value 444 and a first previous-discontinuity destination count value 445, respectively, using comparators 448 and 449, as illustrated. If previous program count value 114 is equal to first previous-discontinuity source count value 444 and current program count value 154 is equal to first previous-discontinuity destination count value 445, as indicated by AND-device 452, inner loop counter 454 is incremented.

In some embodiments, inner loop counter 454 provides an inner loop count to buffer 226 (shown in FIG. 2) via multiplexer 480. Additionally, inner loop counter 454 provides a word count to buffer 260 (shown in FIG. 2) via multiplexer 482. In some examples, inner loop counter 454 generates a prefix according to coded value 318 shown in FIG. 3. In the compression scheme illustrated in FIG. 3, an inner loop counter value is not compressed (e.g., the word count of a coded value for an inner loop count value is not dependent on the magnitude of the inner loop value); accordingly, inner loop counter values according to the scheme illustrated in FIG. 3 can be generated by hard wiring, such that a prefix is appended to a count value. Alternatively, a look-up table or any other suitable method may be used to generate coded values according to the scheme illustrated in FIG. 3. While the scheme illustrated in FIG. 3 does not compress loop count values, compression schemes including loop value compression are within the scope of this invention; and it is to be understood that a loop compressor similar to compressors 224 or 234 (shown in FIG. 2) may be incorporated.

Similarly, loop counter module 440 compares each previous program count value 114 and current program count value 154 generated by program count sequencer 212, to second previous-discontinuity source count value 446 and a second previous-discontinuity destination count value 447, respectively, using comparators 451 and 452. If previous program count value 114 is equal to second previous-discontinuity source count value 446 and current program count value 254 is equal to second previous-discontinuity destination count value 447, as indicated by AND-device 453, an outer loop execution is indicated. Accordingly, the outer loop counter 455 is incremented.

In some embodiments, outer loop counter 455 provides an outer loop count to buffer 236 (shown in FIG. 2) via multiplexer 481. Additionally, outer loop counter 455 provides a word count to buffer 260 (shown in FIG. 2) via multiplexer 482. In some examples, outer loop counter 255 generates a prefix according to coded value 320 shown in FIG. 3. In the compression scheme illustrated in FIG. 3, a loop counter value is not compressed; accordingly, outer loop counter values according to the scheme illustrated in FIG. 3 can be generated by hard wiring, such that a prefix is appended to a count value. Alternatively, a look-up table or any other suitable method may be used to generate coded values according to the scheme illustrated in FIG. 3.

A multiplexer 480 allows both displacement generator module 220 and inner loop counter 454 to fill buffer 226 (shown in FIG. 2), and a multiplexer 481 allows both linear increment generator module 430 and outer loop counter 455 to fill buffer 236 (shown in FIG. 2). Multiplexer 482 allows word counts from each of compressor 424, compression 434, inner loop counter 454, and outer loop counter 455 to fill buffer 260 (shown above in FIG. 2)

A NOR device (gate) 457 generates a logic high unless one of an inner loop execution or an outer loop execution is indicated. Accordingly, Notice of Discontinuity 256 is blocked by AND device 458, thus preventing AND devices 419, 416 from providing an updated discontinuity source PC value 444 and an updated discontinuity destination PC value 445. However, if neither an inner loop execution nor an outer loop execution is indicated by NOR device 457, memory device 442 is updated upon each new discontinuity.

Additionally signal 459 (the output of gate 458) may be provided displacement generator module 220 and linear increment generator module 230 to prevent displacement values 428 and linear increment run values 438 from being calculated if the existence of an inner or outer loop is indicated.

Figure 5A:
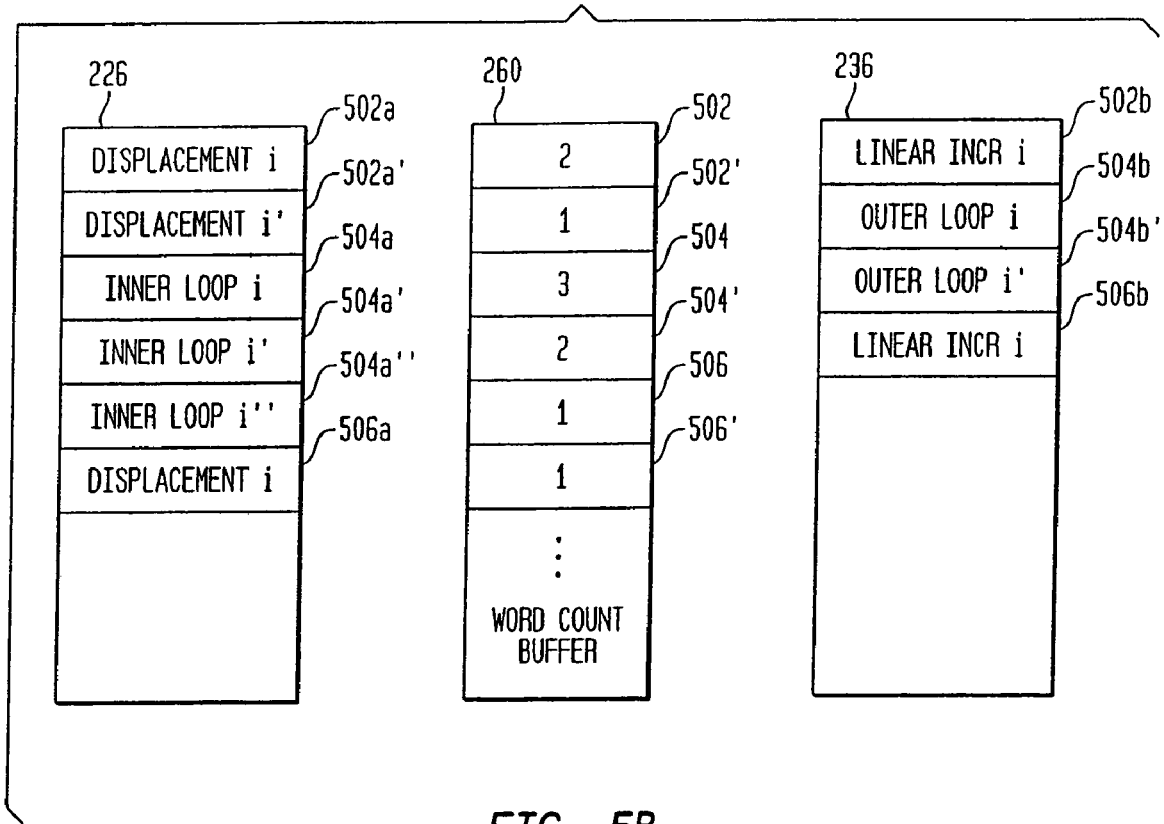
FIG. 5A is a schematic illustration of buffers containing exemplary compressed data structures.

FIG. 5A is a schematic illustration of buffers 226, 260, 236 containing exemplary compressed data structures. In the exemplary embodiment, each of the buffers is a FIFO buffer, where the data at the top word of the buffer (i.e., first location, or address) is the first-in data. Buffer 226 includes two words of displacement data, 502a and 502a', both corresponding to a first displacement value; three words of inner loop count data, 504a, 504a', and 504a'', all corresponding to a first inner loop count value; and one word of displacement data, 506a', corresponding to a second displacement count value.

Buffer 236 includes one word of linear increment count data 502b corresponding to a first displacement count value (and corresponding to displacement value, 502a and 502a'); two words of outer loop count data, 504b, and 504b', both corresponding to a first outer loop count value; and one word of linear increment data, 506b', corresponding to a second linear increment count value (and corresponding to displacement count data 506a). Word count buffer 260 includes word count values corresponding to the data in each of buffers 226 and 236.

Figure 5B:
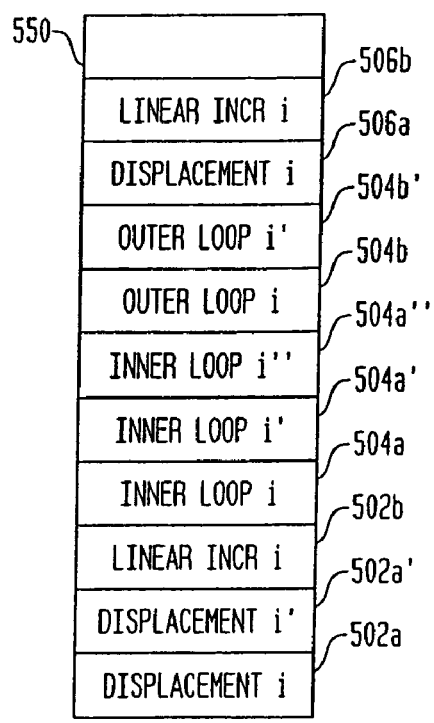
FIG. 5B illustrates a memory including an integrated data structure.

For example, suitably programmed data controller (e.g., data controller 120) may be used to read displacement data, linear increment data, inner loop data, and outer loop data from buffer 526 and buffer 536, such that they form an integrated, compressed program trace. The integrated, compressed program trace may then be decompressed by a decompressor 145 (shown in FIG. 1) to form a decompressed program trace. Integration of the data occurs by reading the word counts 502, 502', 504, 504', 506, 506' and reading the corresponding number of words from buffer 226 and buffer 236 using alternate word counts. For example, according to the illustrated exemplary data structure, the resulting integrated compressed program trace is formed by first reading two words of data 502a, and 502a' from buffer 226, corresponding to word count 502 from buffer. Next, a single word of data 502b is read from buffer 236 corresponding to word count 502' from buffer 260. Then, three words of two words of data 502a, and 502a' are read from buffer 526, corresponding to word count 502 from buffer 260. A memory 550 including the resulting integrated data is illustrated in FIG. 5B. Memory 550 is filled from the bottom up by data read from buffers 226 and 236. Decompression of the resulting integrated data can be achieved using a decompressor 145 (shown in FIG. 1).

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting. The invention is limited only as required by the following claims and equivalents thereto. Also, it is to be understood that the use of the terms "including," "comprising," or "having" is meant to encompass the items listed thereafter and equivalents thereof as well as additional items before, after, or in-between the items listed.

The invention claimed is:

1. A program tracer to trace an execution sequence of a program executing on a processor, the processor having a program counter to maintain program instruction count values for program instructions as they are executed, comprising:

a program count sequencer operatively connected to the program counter to receive a current program count value from the program counter and also receiving notifications of discontinuities in the program instruction flow, the program count sequencer generating a current-discontinuity destination count value in response to a said notification; and a linear increment generator module operatively coupled to the program count sequencer to receive the current program count value and the current-discontinuity destination count value, and calculating a linear increment run length and selectively providing the linear increment run length value in response to notification of a discontinuity in the program.

2. The program tracer of claim 1, further comprising a displacement generator module operatively coupled to the program count sequencer to receive the current program count value and the previous program count value, and in response, calculating a displacement value.

3. The program tracer of claim 1, wherein the displacement generator module selectively provides displacement values in response to notification of discontinuities in the program.

4. A program tracer to trace an execution sequence of a program executing on a processor, the processor having a program counter to maintain program instruction count values for program instructions as they are executed, comprising:

a program count sequencer to receive a current program count value from the program counter and to maintain a previous program count value, and to determine a current-discontinuity source count value and a current-discontinuity destination count value; and a loop count module coupled to the program count sequencer to receive the current-discontinuity source count value and the current-discontinuity destination count value, and to maintain a first previous-discontinuity source count value and a first previous-discontinuity destination count value, and to count loop executions of at least a first loop by comparing the current-discontinuity source count value and the current-discontinuity destination count value to the first previous-discontinuity source count value and the first previous-discontinuity destination count value.

5. A method of tracing an execution sequence of a program executing on a processor having a program counter to maintain program instruction count values for program instructions as they are executed, comprising:

generating a current-discontinuity destination count value in response to a notification of discontinuity; and calculating a linear increment run length based on the current-discontinuity destination value and the current program count values.

6. The method of tracing an execution sequence of claim 5, further comprising selectively providing the linear increment run length value in response to notification of discontinuity in the program.

7. A method of tracing an execution sequence of a program executing on a processor, the processor having a program counter to maintain program instruction count values for program instructions as they are executed, comprising:

determining a current-discontinuity source count value and a current-discontinuity destination count value; and counting loop executions of at least a first loop by comparing a current-discontinuity source count value and the current-discontinuity destination count value to the first previous-discontinuity source count value and the first previous-discontinuity destination count value.

* * * * *